United States Patent [19]

Kub et al.

[11] Patent Number: 4,499,653

[45] Date of Patent: Feb. 19, 1985

[54] SMALL DIMENSION FIELD EFFECT TRANSISTOR USING PHOSPHOROUS DOPED SILICON GLASS REFLOW PROCESS

[75] Inventors: Francis J. Kub, Pasadena; William M. Evey, Baltimore, both of Md.

[73] Assignee: Westinghouse Electric Corp., Pittsburgh, Pa.

[21] Appl. No.: 548,547

[22] Filed: Nov. 3, 1983

[51] Int. Cl.³ .............................................. H01L 21/94
[52] U.S. Cl. ...................................... 29/571; 29/578; 29/590; 148/1.5; 427/93
[58] Field of Search ................. 29/571, 578, 590, 591; 148/1.5; 427/93

[56] References Cited

U.S. PATENT DOCUMENTS

| | | | |
|---|---|---|---|
| 3,739,237 | 6/1973 | Shannon | 29/571 X |
| 3,887,733 | 3/1975 | Tolliver et al. | 427/444 |
| 4,191,603 | 3/1980 | Garbarino et al. | 148/187 |
| 4,204,894 | 5/1980 | Komeda et al. | 148/188 |
| 4,261,765 | 4/1981 | Komatsu et al. | 148/1.5 |
| 4,348,802 | 9/1982 | Shirato | 29/571 |

FOREIGN PATENT DOCUMENTS 55-27659 2/1980 Japan.
55-75219 6/1980 Japan.

*Primary Examiner*—Brian E. Hearn
*Assistant Examiner*—Alan E. Schiavelli
*Attorney, Agent, or Firm*—W. G. Sutcliff

[57] ABSTRACT

A process for fabricating semiconductor devices including a field effect transistor has been described incorporating a substrate, a layer of thermal oxide having windows, a layer of polycrystalline silicon to form the gate electrode of field effect transistors and a first interconnection layer, a layer of silicon nitride, a layer of phosphorous doped silicon dioxide which have windows larger than the device windows and which is reflowed to smooth its upper surface over the polysilicon interconnections and to provide round edges, impurity regions formed on either side of the silicon gate electrode and bounded by the thermal oxide, forming openings to the drain and source regions, depositing a layer of metal over the substrate and defining the layer of metal to form a second layer of interconnections and also to provide ohmic contact to the source and drain regions. The process overcomes the problem of forming openings through a layer of phosphorous doped silicon oxide and further overcomes the problem of subsequent out diffusion of a drain and source impurity region at times when a layer of phosphorous doped silicon oxide is reflowed thus permitting shallow drain and source regions for short channel field effect transistors.

19 Claims, 19 Drawing Figures

SMALL DIMENSION FIELD EFFECT TRANSISTOR USING PHOSPHOROUS DOPED SILICON GLASS REFLOW PROCESS

BACKGROUND OF THE INVENTION

1. Field of the Invention

This invention relates to semiconductor devices and more particularly to a process for making field effect transistors on an integrated circuit using a phosphorous doped silicon glass (PSG) reflow process.

2. Description of the Prior Art

The standard phosphorous doped silicon glass (PSG) reflow technique, presently requires the PSG to be defined and etched to provide source and drain contact windows to a device which may be for example a metal oxide semiconductor field effect transistor (MOSFET). It is noted that polycrystalline silicon may be substituted for the metal gate. The main disadvantages of the processing procedure for the standard reflow process where the PSG is defined and etched at each contact window, is that with wet chemical etching, a large amount of ballooning of the PSG may occur at the contact window. With the ballooning of the PSG at the contact window it is very hard to avoid shorting the source and drain diffusion previously made to the gate when metal is deposited in the contact window to provide an electrical interconnection to the source and drain.

A second disadvantage of the standard reflow process is that the phosphorous doped silicon glass reflow is typically done at a high temperature such as 1050° C. If a very heavy phosphorous concentration is used in the doped PSG then the temperature of the PSG reflow may be reduced perhaps as far as 900° C. The high temperature at which PSG reflow occurs tends to drive any PN junction formed prior to the reflow step deeper and thus it is hard to obtain a shallow PN junction necessary for short channel metal oxide semiconductor field effect transistors (MOSFET).

In U.S. Pat. No. 3,887,733 which issued on June 3, 1975 to D. L. Tolliver et al., a doped oxide reflow process is described with hydroxyl ions in contact with the doped oxide while the doped oxide is at a temperature of 1050° C. shortens the time for reflow of about 10 minutes.

In U.S. Pat. No. 4,191,603 which issued on Mar. 4, 1980 to P. L. Garbarino et al., the formation of phosphosilicate glass (PSG) is described as an insulation layer followed by a heat cycle to form the "snapped-back" PSG layer at its edges after etching through the PSG layer and a polysilicon layer. The heat cycle is provided in a nitrogen atmosphere at approximately 1000° C. for approximately one hour.

In U.S. Pat. No. 4,204,894 which issued on May 27, 1980 to T. Komeda et al., a process for fabricating semiconductor devices is described by forming a first insulating layer containing regions of n or p type impurities. A second insulating layer is formed over the first insulating layer wherein the second insulating layer is meltable at low temperature. Portions of the first and second insulating layers are removed so as to selectively expose the semiconductor wafer. A third insulating layer is formed containing regions of n or p type impurities over the surface of said semiconductor wafer. The wafer is heated so as to fluidize, soften or melt the second insulating layer while diffusing the n or p type impurities in the first and third insulating layers into the semiconductor wafer. The third insulating layer is removed by selective etching.

In Japanese Pat. No. 55-75219 which issued on June 6, 1980 to S. Mimura, the source and drain regions in a channel are formed by one high temperature thermal treatment. A phosphosilicate glass (PSG) layer is deposited over a semiconductor wafer having thermal oxide thereon previously etched to form source and drain windows. The PSG layer is etched over and adjacent to the source and drain windows. A second PSG layer is deposited over the first PSG layer and over the source and drain windows. A thermal treatment in nitrogen gas at 1000° C. permits impurities in the second PSG layer to be diffused into the semiconductor wafer forming source and drain regions.

When using PSG which reflows at a temperature between 900° C. to 1050° C., it is desirable to form the source and drain regions by ions implantation after the PSG is reflowed to provide shallower source and drain regions such as for small geometry MOSFET transistors.

Since PSG has a tendency to balloon when contact windows are opened which results in gate to drain shorts when the contact metal is deposited, it is desirable to circumvent the need of opening contact windows through the PSG.

It is further desirable to define PSG several microns outside the thin oxide active device window, i.e., outside the drain gate and source regions.

It is further desirable to provide a fabrication process wherein PSG is reflowed prior to forming the drain and source regions and wherein the source and drain regions are self aligned with coplanar thermal oxide and wherein no contact windows are necessary.

It is further desirable to provide a fabrication process wherein PSG is reflowed prior to forming the drain and source regions and wherein the source and drain regions are self aligned with coplanar oxide and wherein contact windows are provided by a defined layer of silicon nitride.

SUMMARY OF THE INVENTION

In accordance with the present invention, a method is provided for fabricating semiconductor devices including a field effect transistor and first and second levels of interconnections on a semiconductor substrate by forming a first layer of silicon oxide over the semi-conductor substrate, forming a window in the first layer of silicon oxide on the semiconductor substrate forming a second layer of silicon oxide on the semiconductor substrate in the window, forming a layer of polycrystalline silicon over the first and second layers of silicon oxide, defining the layer of polycrystalline silicon to form the gate electrode of the field effect transistor and to form conductive paths to provide the first level of interconnections, forming a layer of silicon nitride over the first and second layers of silicon oxide, the gate electrode, and the first level of interconnections, forming a third layer of silicon oxide doped with phosphorous over the layer of silicon nitride, defining the third layer of silicon oxide including removing said third layer of silicon oxide over said window and outside said window by a predetermined distance, reflowing the third layer of silicon oxide whereby the upper surface of the third layer of silicon oxide is smoothed and its edges rounded, forming first and second impurity regions in the substrate in the window on each side of the gate electrode to form the source and drain of the field effect transistor, removing selected portions of the silicon nitride layer and of the second layer of silicon oxide to expose the first and second impurity regions, forming metal over the third layer of silicon oxide and the first and second impurity regions, and defining the layer of metal to form conductive paths to the first and second impurity regions and to form conductive paths to provide the second level of interconnections.

The invention further provides an alternate method wherein after the step of reflowing the third layer of silicon oxide, the following steps are performed: removing selected portions of the silicon nitride layer and of the second layer of silicon oxide to expose first and second areas of the semiconductor substrate in the window of each side of the gate electrode, forming first and second impurity regions below the first and second areas, respectively, to form the source and drain of the field effect transistor, forming metal over the third layer of silicon oxide, and the first and second impurity regions, and defining the layer of metal to form conductive paths to the first and second impurity regions and to form conductive paths to provide the second level of interconnections.

DESCRIPTION OF THE PREFERRED EMBODIMENT

Figure 1:
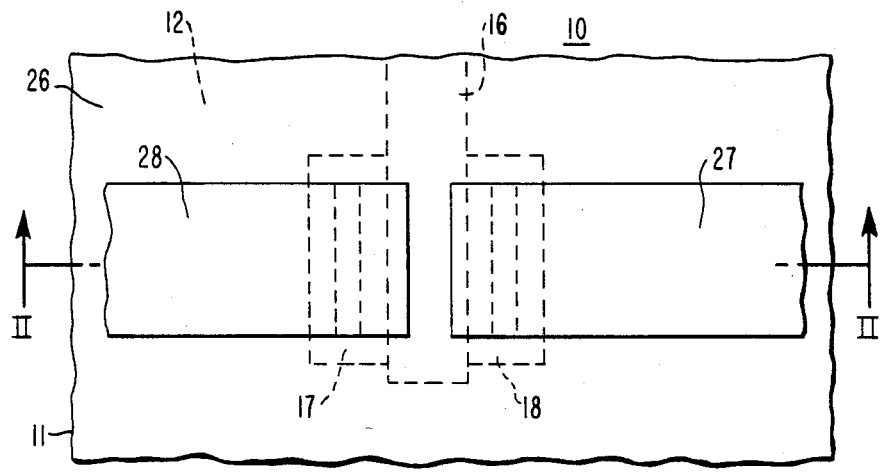
FIG. 1 is a top view of a field effect transistor of the prior art.
Figure 2:
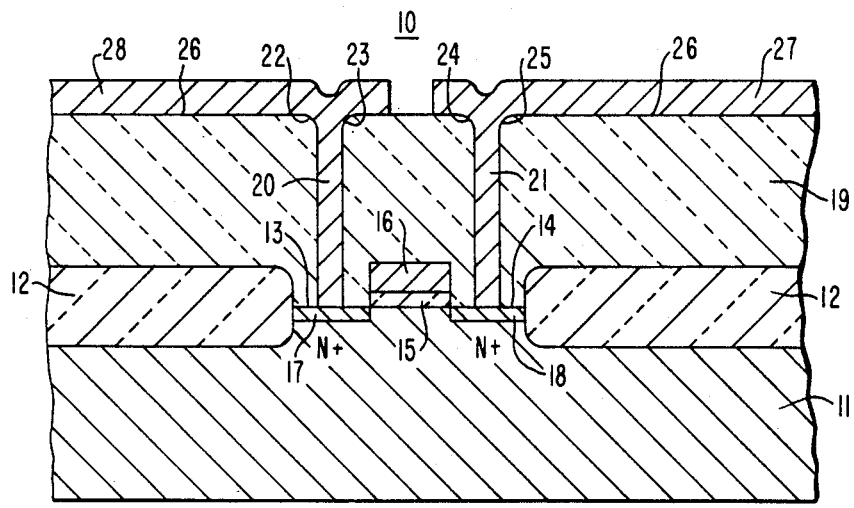
FIG. 2 is a cross section view along the lines II—II of FIG. 1.

Referring to the drawing and in particular to FIGS. 1 and 2, a field effect transistor 10 of the prior art is shown. A silicon substrate 11 of P type material has a layer of thermal oxide 12 grown on the upper surface 13 of substrate 11. A portion of silicon oxide 12 in a selected area is removed which may for example be rectangular in area to form a window 14 exposing upper surface 13 of substrate 11. A second layer of silicon oxide 15 and a layer of polycrystalline silicon 16 is deposited on substrate 11 in window 14 and subsequently etched to form the gate dielectric 15 and gate electrode 16. Impurity regions 17 and 18 which may for example be N+ are formed in substrate 11 on each side of gate electrode 16. Impurity regions 17 and 18 may be formed by ion implantation and may be self aligned to the silicon oxide 12 and gate electrode 16. A layer of phosphorous doped silicon oxide is deposited by chemical vapor deposition wherein the deposited silicon oxide is heavily doped with phosphorous. Openings 20 and 21 are etched in silicon oxide layer 19 such as by wet chemical etching to expose impurity regions 17 and 18. Silicon oxide layer 19 is subsequently reflowed by raising the temperature of silicon oxide layer 19 to 1050° C. for a predetermined time period wherein corners 22-25 are rounded and the upper surface 26 of silicon oxide layer 19 is smooth. Subsequent to the step of reflowing silicon oxide layer 19, openings 20 and 21 may be re-etched to remove any oxide layer over impurity regions 17 and 18 in openings 20 and 21.

A metal 27 suitable for ohmic contact or a sequence of metals suitable for ohmic contact are deposited in openings 20 and 21 and on upper surface 26 of silicon oxide layer 19. Metal 27 may for example be aluminum or a first layer of tungsten and a second layer of aluminum. Metal 27 is subsequently etched to define interconnection patterns and conductive paths. The resulting structure forms field effect transistor 10 where impurity regions 17 and 18 are the source and drain respectively and polycrystalline silicon layer 16 forms the gate electrode. Openings 20 and 21 through silicon oxide layer 19 are positioned approximately one to two micrometers away from gate electrode 16.

Figure 3:
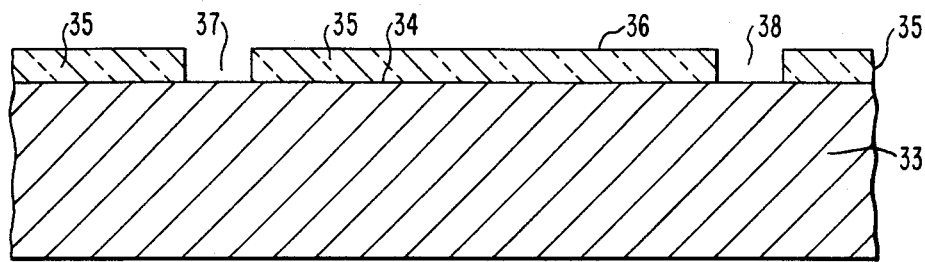
FIGS. 3-14 are cross section views along the lines XIV—XIV of FIG. 15 illustrating the process steps of the present invention.
Figure 15:
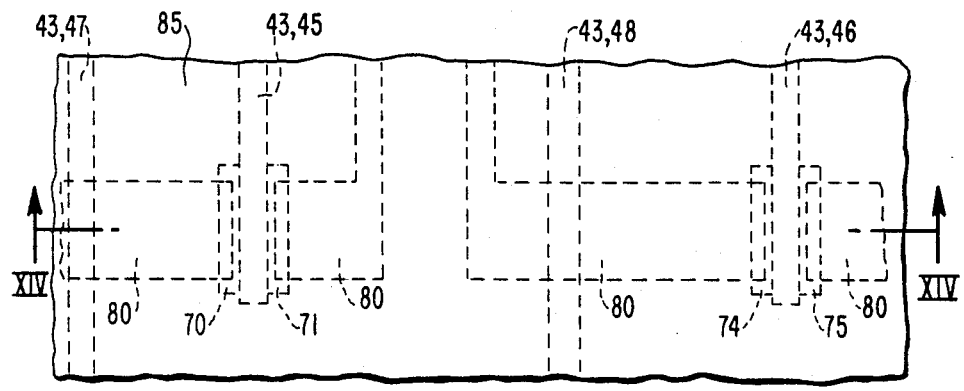
FIG. 15 is a top view of the embodiment made by the method of the present invention.
Figure 14:
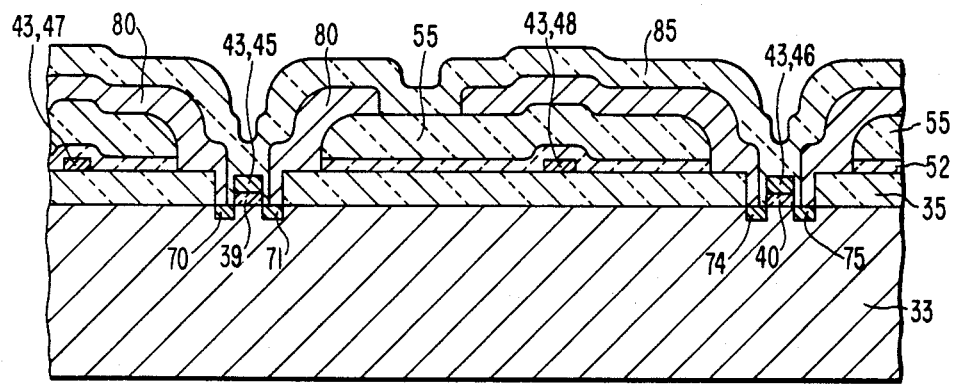

The method of the present invention may be better understood by referring to FIGS. 3-14 which are cross section views along the lines XIV—XIV of FIG. 15. FIGS. 3-14 illustrate a process for fabricating semiconductor devices including a field effect transistor and first and second levels of interconnections on a semiconductor substrate. Referring to FIGS. 3, a semiconductor substrate 33 is shown having an upper surface 34. Semiconductor substrate 33 may for example be silicon. A layer of silicon oxide 35 is formed on upper surface 34 of substrate 33. Silicon oxide layer 35 may be grown thermally and has an upper surface 36. Openings 37 and 38 are formed in silicon oxide layer 35 by etching for example to expose substrate 33. Openings 37 and 38 function as windows in silicon oxide layer 35 wherein a field effect transistor may be fabricated in each opening.

Figure 4:
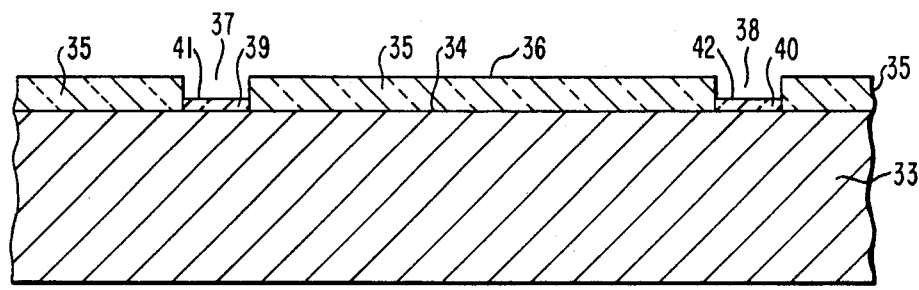

Referring to FIG. 4, a second layer of silicon oxide 39 and 40 are formed on substrate 33 in openings 37 and 38 respectively. Silicon oxide layers 39 and 40 have a predetermined thickness and may provide the gate dielectric for field effect transistors devices formed in windows 37 and 38 respectively.

Figure 5:
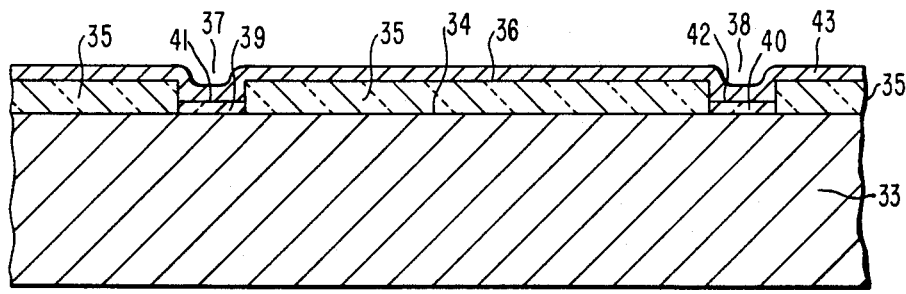

Referring to FIG. 5 a polycrystalline silicon layer 43 is formed on the upper surface 36 of silicon oxide layer 35 and on the upper surface 41 of silicon oxide layer 39 and on the upper surface 42 of silicon oxide layer 40. Polycrystalline silicon layer 43 may be doped with impurities to be conductive.

Figure 6:
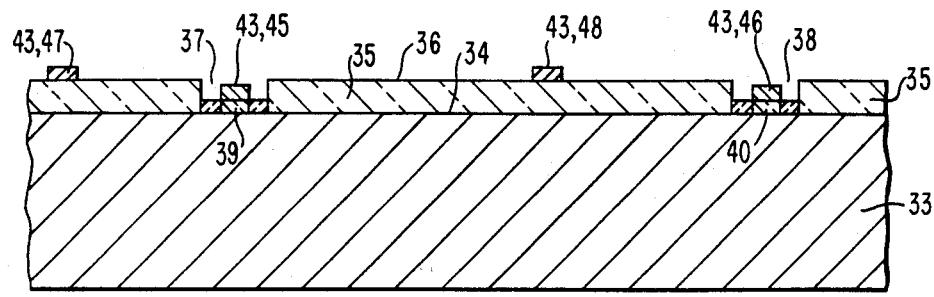

Polycrystalline silicon layer 43 may be defined or etched as shown in FIG. 6 to form the gate electrodes 45 and 46 of field effect transistors to be formed in openings 37 and 38 respectively and to form conductive paths such as paths 47 and 48 to provide a first level of interconnections on upper surface 36 of silicon oxide layer 35.

Figure 7:
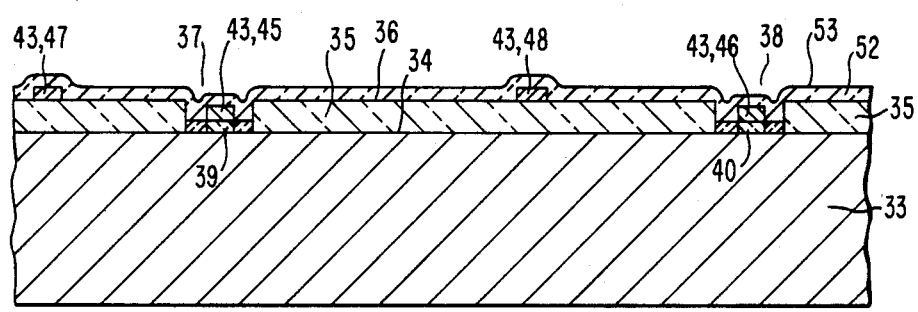

Referring to FIG. 7 a layer of silicon nitride 52 is deposited over silicon oxide layer 35, silicon oxide layers 39 and 40, gate electrodes 45 and 46, and conductive paths 47 and 48. Silicon nitride layer 52 has an upper surface 53.

Figure 8:
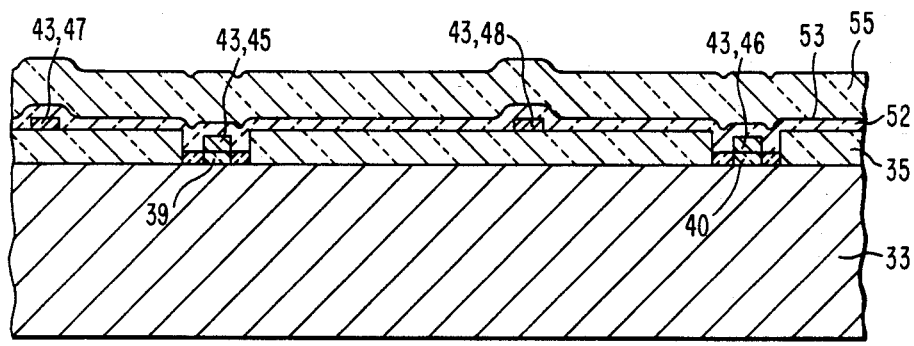

Referring to FIG. 8, a layer 55 of phosphorous doped silicon oxide is deposited on upper surface 53 of silicon nitride layer 52. Layer 55 may for example have a thickness in the range from 5,000 to 15,000 angstroms. Layer 55 may be deposited by chemical vapor deposition.

Figure 9:
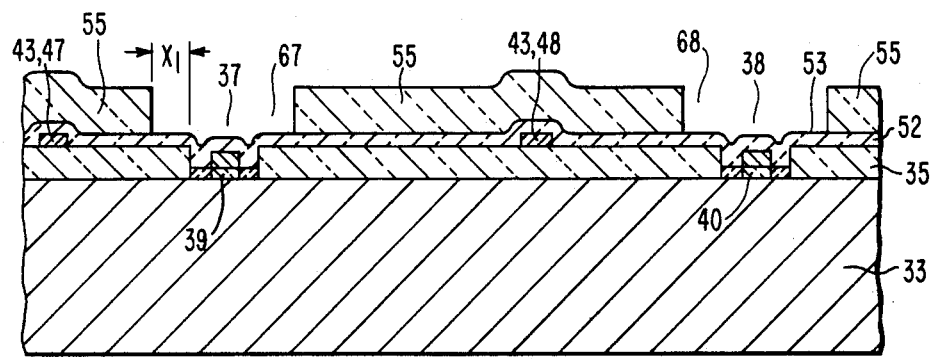

Referring to FIG. 9 layer 55 of phosphorous doped silicon oxide is defined or etched down to upper surface 53 of silicon nitride layer 52 in the region above windows 37 and 38 and outside windows 37 and 38 above silicon oxide layer 35 and silicon nitride layer 52 for a predetermined distance from the edge of windows 37 and 38 to form windows or openings 67 and 68. The predetermined distance may be in the range from one to five microns. As indicated in FIG. 9 by the dimension $X_1$.

Figure 10:
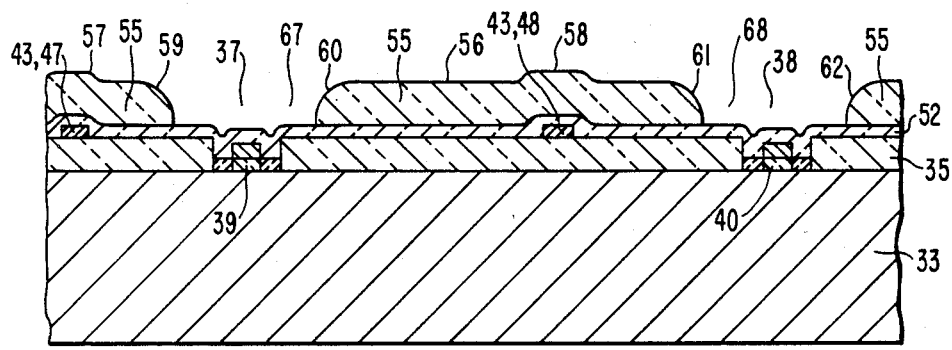

Referring to FIG. 10, layer 55 of phosphorous doped silicon oxide is reflowed by raising the temperature of layer 55 to a predetermined temperature such as in the range from 900° C. to 1050° C. whereby the edges 59-62 of layer 55 are rounded and the upper surface 56 is smooth such as for example where layer 55 passes over conductive paths 47 and 48 to ensure subsequent conductive path crossing over or metal coverage over steps by the second level of interconnections. FIG. 10 shows the smooth upper surface 56 above conductor paths 47 and 48 as surfaces 57 and 58, respectively.

Figure 11:
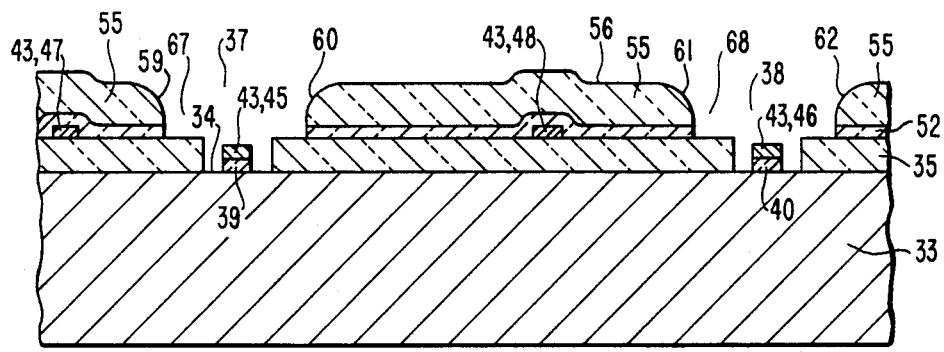

Referring to FIG. 11 silicon nitride layer 52 is removed in openings 67 and 68 in silicon oxide layer 55. With portions of silicon nitride layer 52 removed portions of silicon oxide layers 39 and 40 are exposed in windows 37 and 38 on either side of gate electrodes 45 and 46. Silicon oxide layers 39 and 40 where exposed are subsequently etched with a suitable etching or etching process to remove exposed silicon oxide layers 39 and 40 down to upper surface 34 of substrate 33.

Figure 12:
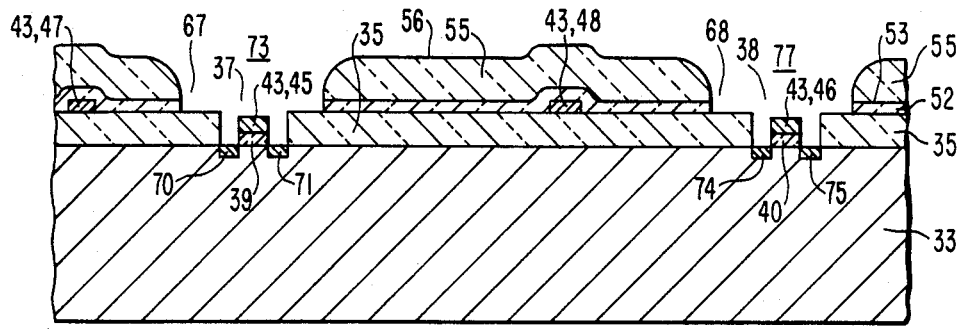

Referring to FIG. 12, impurity regions 70 and 71 are formed in substrate 33 in window 37 on each side of gate electrode 45 to form the source and drain of field effect transistor 73. Impurity regions 70 and 71 are self aligned with respect to silicon oxide layer 75 and polysilicon gate electrode 45.

Impurity regions 74 and 75 are formed in substrate 33 in window 38 on each side of gate electrode 46 to form the source and drain of field effect transistor 77. Impurity regions 74 and 75 are self aligned with respect to silicon oxide layer 35 and polysilicon gate electrode 46.

Figure 13:
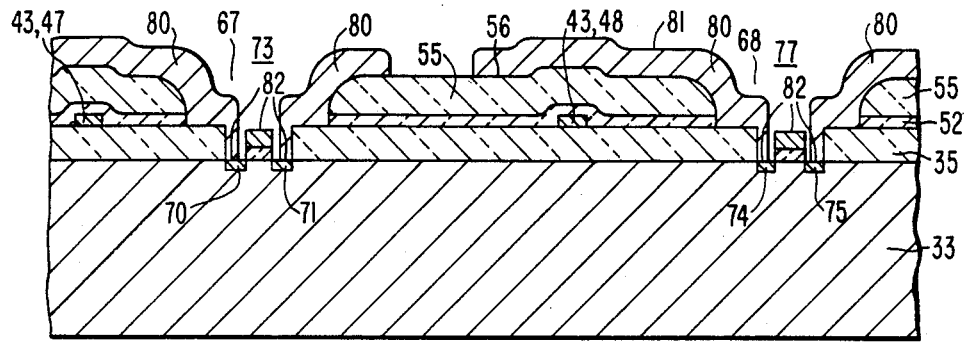

A layer 80 of conductive material such as metal, for example, aluminum 6,000 to 12,000 angstroms thick, is deposited over layer 55 of phosphorous doped silicon oxide, and over openings 67 and 68 as shown in FIG. 13. Conductive material 80 is defined or etched to form conductive paths to impurity regions 70, 71, 74 and 75 and to form other conductive paths to provide a second level of interconnections, which at the same time provides crossovers over the first level of interconnections.

As shown in FIG. 13 layer 80 is in contact with impurity regions 70, 71, 74 and 75 and is bounded by silicon oxide 35 which forms the contact window on three sides along with a space on the side adjacent gate electrodes 45 and 46. The space is provided by etching between gate electrodes 45 and 46 and layer 80. In etching layer 80, an etchant may be used which will etch layer 80 and not polycrystalline silicon 43 which forms gate electrodes 45 and 46, substrate 33, silicon nitride, or silicon oxide. For example if layer 80 is aluminum one example of an etchant is 80% phosphoric acid, 16% acetic acid, and 4% nitric acid.

Alternatively layer 80 may include first a metal layer 82 that will only adhere to silicon and not adhere to silicon oxide for example, tungsten may be selectively deposited by chemical vapor deposition on exposed regions of polycrystalline silicon layer 43 and substrate 33. Subsequently a layer 83 of metal such as aluminum may be deposited as part of layer 80 which will be deposited over metal layer 82 (tungsten) and over silicon oxide layers 35 and 55. The aluminum may be etched for example by a plasma edge wherein the tungsten will act as an etch barrier and therefore protect polycrystalline silicon layer 43 and substrate 33 from being etched at times when the aluminum is etched. Metal layer 82 in FIG. 13 represent a selectively deposited barrier such as tungsten which adheres to silicon and not to silicon oxide.

An additional layer 85 of silicon oxide may be chemically vapor deposited over the upper surface 81 of layer 80 and over windows 67 and 88 as well as over exposed regions of layer 55. Field effect transistors 73 and 77 as well as layer 80 are therefore protected by the passivation layer 85 from physical damage such as by scraping or from external contaminants.

A top view of field effect transistors 73 and 77 is shown in FIG. 15. Note that windows 67 and 68 in layer 55 of phosphorous doped silicon oxide is spaced from the edge of coplanar oxide 35. Short channel field effect transistors may therefore be formed without the difficulty of etching through layer 55 of silicon oxide to open contact windows for ohmic contact to impurity regions 70, 71, 74 and 75. Furthermore layer 55 of silicon oxide is reflowed prior to the formation of impurity region 70, 71, 74 and 75. Thus when impurity regions 70, 71, 74 and 75 are formed they do not subsequently experience the temperatures required to reflow layer 55 and thus impurity regions 70, 71, 74 and 75 may be formed at a predetermined depth which may be shallow and which will remain at the predetermined depth or substantially close thereto during subsequent processing.

Figure 19:
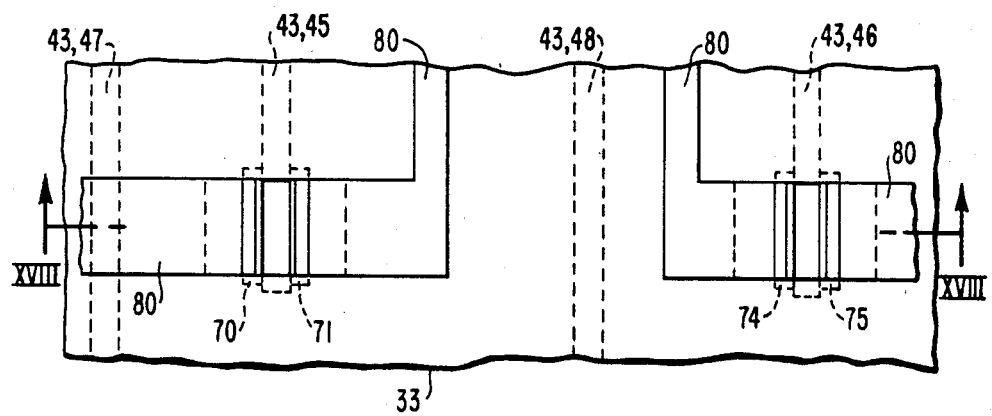
FIG. 19 is a top view of an embodiment made by an alternate method of the present invention.
Figure 18:
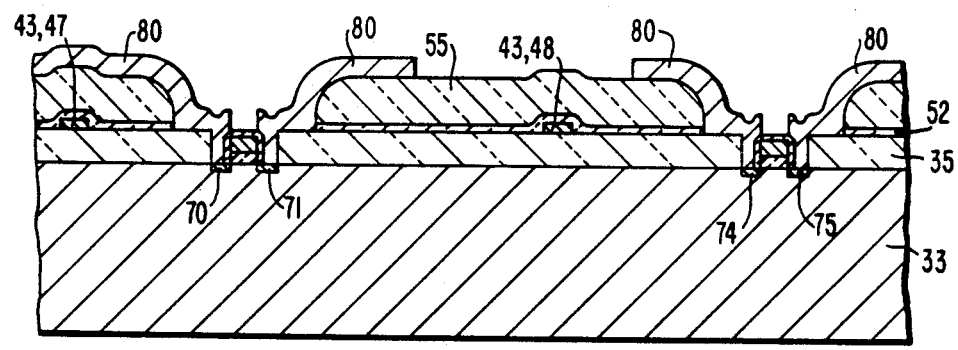

FIGS. 6, 6-18 are cross section views along the lines XVIII—XVIII of FIG. 19 illustrating the process steps of an alternate method wherein a layer of siicon nitride may cover polysilicon gate electrodes 45 and 46 to protect it during etching of the conductive layer making ohmic contact to the impurity regions. Further the silicon nitride layer may be defined to form windows on impurity regions 70, 71, 74 and 75. The windows provide an area within the region for the conductive layer to make ohmic contact. Referring to FIG. 6 silicon oxide layer 39 and 40 are etched where not covered by gate electrode 45 and 46. Silicon oxide layers 39 and 40 are etched down to the upper surface 34 of substrate 33.

The process steps illustrated and described with respect to FIGS. 7-10 are performed as before except for the structural modification of silicon oxide layers 39 and 40.

Figure 16:
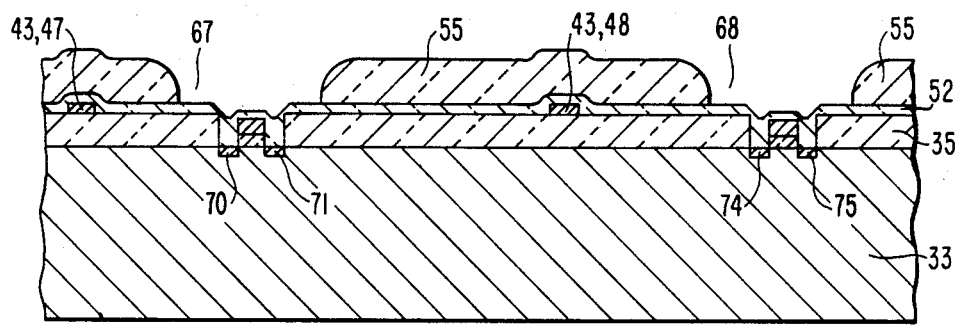
FIGS. 16-18 are cross sectiion views along the lines XVIII—XVIII of FIG. 19 illustrating an alternate method of the present invention.

Referring to FIG. 16 impurity regions 70, 71, 74 and 75 may be formed by ion implantation of impurities through layer 52 of silicon nitride. Silicon oxide layer 35 as well as polycrystalline gates 45 and 46 act as a barrier to the ion implantation of impurities.

Figure 17:
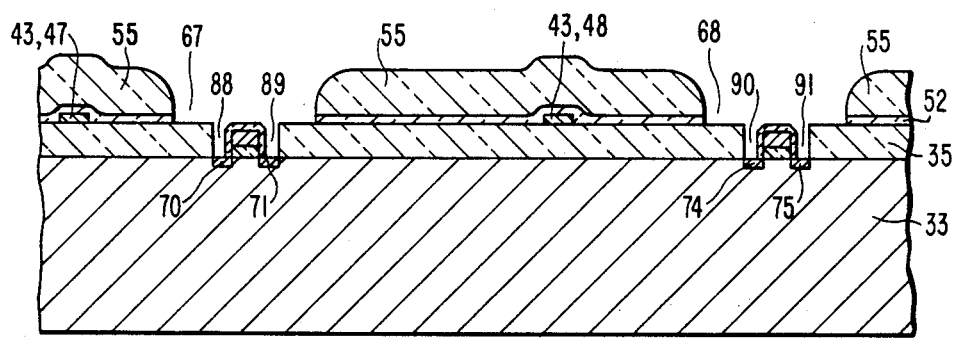

Next the silicon nitride layer 55 is defined by etching to provide contact windows 88-91 to impurity regions 70, 71, 74 and 75 as shown in FIG. 17. A layer of conductive material 80 such as aluminum is deposited over silicon oxide layer 55, and windows 67 and 68. Layer 80 of conductive material may be subsequently etched with a suitable etchant or by plasma etching with silicon nitride layer 52 protecting substrate 33 and polycrystalline silicon gates 45 and 46. Furthermore layer 80 is protected from shorting the drain or source of transistors 73 or 77 to the gate electrode 45 and 46 by silicon nitride layer 52. Silicon nitride layer 52 may extend over silicon oxide layer 35 to provide a window at impurity regions 70, 71, 74 and 75 and to prevent shorting of conductive layer 80 to substrate 33 at the boundary between the impurity region and silicon oxide layer 35.

FIG. 19 shows a top view of an embodiment made by the alternate method.

A process sequence has been described that reflows phosphorus doped silicon oxide prior to the formation of the drain and source of field effect transistors thereby permitting shallow drain and source regions. Furthermore the phosphorus doped silicon oxide is defined or removed several microns outside of the device window so that contact windows through the phosphorus doped silicon oxide which may be as thick as from 10 to 15,000 Angstroms are not required. Since the phosphorus doped silicon oxide does not act as a contact window, the original thermal oxide layer may be used as a contact window or a layer of silicon nitride deposited over the original thermal oxide and over a polysilicon gate may act as the contact window. Where the contact metal is aluminum and the gate electrode of a field effect transistor is polycrystalline silicon, tungsten may be deposited over the drain and source and polycrystalline silicon gate prior to deposition of aluminum whereby the tungsten will act as a barrier during plasma etch of the aluminum.

Alternatively where aluminum is used as a contact metal and the gate is polycrystalline silicon, an etchant may be selected which will etch aluminum without etching the silicon. By using the described process sequence, an integrated circuit may be formed having two levels of interconnections. The first level may be made with polycrystalline silicon and the second level with a metal such as aluminum. Short channel field effect transistors may be fabricated having shallow drain and source regions which are formed after an insulation layer of phosphorous doped silicon oxide is deposited, defined or etched and reflowed.

We claim:

1. A process for fabricating semiconductor devices including a field effect transistor and first and second levels of interconnections on a semiconductor substrate comprising the steps of:
   forming a first layer of silicon oxide over said semiconductor substrate,
   forming a window in said first layer of silicon oxide,
   forming a second layer of silicon oxide on said semiconductor substrate in said window,
   forming a layer of polycrystalline silicon over said first and second layers of silicon oxide,
   defining said layer of polycrystalline silicon to form the gate electrode of said field effect transistor in said window and to form conductive paths to provide said first level of interconnections,
   forming a layer of silicon nitride over said first and second layers of silicon oxide, said gate electrode, and said first level of interconnections,
   forming a third layer of silicon oxide doped with phosphorus over said layer of silicon nitride,
   defining said third layer of silicon oxide including removing said third layer of silicon oxide over said window and outside said window by a predetermined distance,
   reflowing said third layer of silicon oxide whereby the upper surface of said third layer of silicon oxide is smoothed and its edges rounded,
   removing selected portions of said silicon nitride layer and of said second layer of silicon oxide to expose first and second areas of said semiconductor substrate in said window on each side of said gate electrode,
   forming first and second impurity regions below said first and second areas, respectively, to form the source and drain of said field effect transistor,
   forming a layer of metal over said third layer of silicon oxide, and said first and second impurity regions, and
   defining said layer of metal to form conductive paths to said first and second impurity regions and to form conductive paths to provide said second level of interconnections.

2. The process of claim 1 wherein said predetermined distance is in the range from 1 to 5 micrometers.

3. The process of claim 1 wherein said third layer of silicon oxide has a thickness in the range from 5,000 to 15,000 angstroms.

4. The process of claim 1 wherein said step of forming first and second impurity regions includes diffusing impurities into said first and second impurity regions.

5. The process of claim 1 wherein said step of forming first and second impurity regions includes the step of ion implanting ions to form said first and second impurity regions.

6. The process of claim 1 wherein said step of forming a layer of metal includes forming a layer of aluminum.

7. The process of claim 1 wherein said step of defining said layer of metal includes etching said metal with an etchant that will not attack silicon.

8. The process of claim 1 wherein said step of forming metal includes the step of chemically vapor depositing tungsten onto said first and second impurity regions and onto said defined layer of polycrystalline silicon.

9. The process of claim 8 wherein said step of forming a layer of metal includes depositing a layer of aluminum over said tungsten, said first layer of oxide and said third layer of silicon oxide.

10. The process of claim 1 wherein said step of removing selected portions of said silicon nitride layer and of said second layer of silicon oxide includes removing said silicon nitride layer up to the edge of said reflowed third layer of silicon oxide.

11. The process of claim 1 wherein said step of removing selected portions of said silicon nitride layer and of said second layer of silicon oxide includes removing said second layer of silicon oxide in said window up to the edge of said polycrystalline silicon.

12. The process of claim 1 further including, after the step of forming first and second impurity regions, a step of forming a second layer of silicon nitride over said third layer of silicon oxide, said defined layer of polycrystalline silicon, said first layer of silicon dioxide and said first and second impurity regions and defining said silicon nitride layer to provide openings to said first and second impurity regions.

13. The process of claim 12 further including the step of forming a fourth layer of silicon oxide over said first and second impurity regions prior to forming said second layer of silicon nitride.

14. A process for fabricating semiconductor devices including a field effect transistor and first and second levels of interconnections on a semiconductor substrate comprising the steps of:
   forming a first layer of silicon oxide over said semiconductor substrate,
   forming a window in said first layer of silicon oxide,
   forming a second layer of silicon oxide on said semiconductor substrate in said window,
   forming a layer of polycrystalline silicon over said first and second layers of silicon oxide, defining said layer of polycrystalline silicon to form the gate electrode of said field effect transistor in said window and to form conductive paths to provide said first level of interconnections, forming a layer of silicon nitride over said first and second layers of silicon oxide, said gate electrode, and said first level of interconnections, forming a third layer of silicon oxide doped with phosphorus over said layer of siliicon nitride, defining said third layer of silicon oxide including removing said third layer of silicon oxide over said window and outside said window by a predetermined distance, reflowing said third layer of silicon oxide whereby the upper surface of said third layer of silicon oxide is smoothed and its edges rounded, forming first and second impurity regions in said window on each side of said gate electrode to form the source and drain of said field effect transistor, removing selected portions of said silicon nitride layer and of said second layer of silicon oxide to expose said first and second impurity regions, forming a layer of metal over said third layer of silicon oxide, and said first and second impurity regions, defining said layer of metal to form conductive paths to said first and second impurity regions and to form conductive paths to provide said second level of interconnections.

15. The process of claim 14 wherein said predetermined distance is in the range from 1 to 5 micrometers.

16. The process of claim 14 wherein said third layer of silicon oxide has a thickness in the range from 5,000 to 15,000 angstroms.

17. The process of claim 14 wherein said step of forming first and second impurity regions includes the step of ion implanting ions to form said first and second impurity regions.

18. The process of claim 14 wherein said step of forming a layer of metal includes forming a layer of aluminum.

19. The process of claim 14 wherein said step of defining said layer of metal includes etching said metal with an etchant that will not attack silicon.

* * * * *